United States Patent
Kawasumi et al.

(10) Patent No.: US 7,829,942 B2
(45) Date of Patent: Nov. 9, 2010

(54) STATIC SEMICONDUCTOR MEMORY DEVICE

(75) Inventors: Atsushi Kawasumi, Kawasaki (JP); Tetsu Morooka, Tsukuba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 196 days.

(21) Appl. No.: 12/015,730

(22) Filed: Jan. 17, 2008

(65) Prior Publication Data

US 2008/0173955 A1    Jul. 24, 2008

(30) Foreign Application Priority Data

Jan. 17, 2007    (JP)    ............. 2007-008082

(51) Int. Cl.
*H01L 27/11*    (2006.01)
*H01L 29/76*    (2006.01)

(52) U.S. Cl. ............. 257/330; 257/302; 257/331; 257/334; 257/347; 257/351; 257/E21.661; 257/E21.703; 257/E27.098; 257/E27.099; 365/154; 365/189.09; 365/189.11; 438/231; 438/238; 438/270

(58) Field of Classification Search ............. 257/302, 257/330, 331, 334, 347, 351, E21.661, E21.703, 257/E27.098, E27.099; 365/154, 189.09, 365/189.11; 438/231, 238, 270; *H01L 27/11, H01L 29/76*

See application file for complete search history.

(56) References Cited

U.S. PATENT DOCUMENTS

| | | | | |
|---|---|---|---|---|
| 4,920,397 A | * | 4/1990 | Ishijima | ............. 257/334 |
| 5,122,846 A | * | 6/1992 | Haken | ............. 257/66 |
| 5,981,995 A | * | 11/1999 | Selcuk | ............. 257/330 |
| 6,309,930 B1 | * | 10/2001 | Goebel et al. | ............. 438/270 |

FOREIGN PATENT DOCUMENTS

| | | |
|---|---|---|
| JP | 02-141992 | 5/1990 |
| JP | 05-304274 | 11/1993 |

* cited by examiner

*Primary Examiner*—Dao H Nguyen
(74) *Attorney, Agent, or Firm*—Turocy & Watson, LLP (57) ABSTRACT

A first transfer transistor includes a first diffusion layer connected to a first bit line, and a second diffusion layer connected to a first storage node, the first diffusion layer is provided in a substrate, the second diffusion layer is provided in a bottom part of a recess provided in the substrate, a channel region of the first transfer transistor is offset with respect to the second diffusion layer toward the first storage node, and the offset part functions as a resistor.

6 Claims, 11 Drawing Sheets

STATIC SEMICONDUCTOR MEMORY DEVICE

CROSS-REFERENCE TO RELATED APPLICATIONS

This application is based upon and claims the benefit of priority from prior Japanese Patent Application No. 2007-008082, filed Jan. 17, 2007, the entire contents of which are incorporated herein by reference.

BACKGROUND OF THE INVENTION

1. Field of the Invention

The present invention relates to a static semiconductor memory device, for example, a static random access memory (SRAM).

2. Description of the Related Art

A general SRAM composed of six MOSFETs is made up of pull-down transistors (driving transistors) each of which is connected to a storage node and the ground at both ends thereof, load transistors each of which is connected to a storage node and the power source at both ends thereof, pass gate transistors (transfer transistors) each of which is connected to a storage node and a bit line at both ends thereof. In order to enhance stability at the time of data reading of an SRAM, it is necessary to make the driving force of the pull-down transistor larger than that of the pass gate transistor, thereby preventing the voltage of the storage node from exceeding the threshold of the pass gate transistor.

Heretofore, in order to make a difference in driving force between the pull-down transistor and the pass gate transistor, a method has been used in which the Lw/Lg ratio of the pull-down transistor is made larger than that of the pass gate transistor. However, reduction in the cell-size of the SRAM is required with the times. Hence, it has become difficult to make a difference in gate width between these transistors.

Only for the purpose of enhancing the stability at the time of data reading of the SRAM, it is possible to make the driving force of the pass gate transistor degraded. However, when data is written, driving force is required of the pass gate transistor, and hence it is inexpedient to employ this method.

Thus, a method has been developed in which an increase in the cell area is suppressed, resistance is connected to the pass gate transistor and the storage node at both ends thereof, the read data is prevented from being corrupted even when the word line is made thin (see for example, Jpn. Pat. Appln. KOKAI Publication No. 05-304274).

However, it is required to further suppress an increase in the cell area, improve write characteristic, and secure stability at the time of data reading.

Thus, a static semiconductor memory device in which write characteristic is improved by preventing the cell area from increasing, and stability at the time of data reading can be secured is demanded.

BRIEF SUMMARY OF THE INVENTION

According to a first aspect of the invention, there is provided a static semiconductor memory device comprising: first and second storage nodes configured to store complementary data; a first transfer transistor connected between the first storage node and a first bit line; and a second transfer transistor connected between the second storage node and a second bit line, wherein each of the first and second transfer transistors is provided with a first diffusion layer connected to the first or second bit line and including an extension region, and a second diffusion layer connected to the first or second storage node and including an extension region, and the first diffusion layer is provided in a surface region of a substrate, and the second diffusion layer is provided in a bottom part of a recess provided in the substrate.

According to a second aspect of the invention, there is provided a static semiconductor memory device comprising: first and second storage nodes configured to store complementary data; a first transfer transistor connected between the first storage node and a first bit line; and a second transfer transistor connected between the second storage node and a second bit line, wherein each of the first and second transfer transistors is provided with a first diffusion layer connected to the first or second bit line and including an extension region, and a second diffusion layer connected to the first or second storage node and including an extension region, and the first diffusion layer is provided in a surface region of a substrate, and the second diffusion layer is provided in a semiconductor layer provided on the substrate.

According to a third aspect of the invention, there is provided a static semiconductor memory device comprising: first and second storage nodes configured to store complementary data; a first transfer transistor connected between the first storage node and a first bit line; and a second transfer transistor connected between the second storage node and a second bit line, wherein each of the first and second transfer transistors is provided with a first source/drain region connected to the first or second bit line, and a second source/drain region connected to the first or second storage node, and the resistance of the second source/drain region is set greater than the resistance of the first source/drain region.

DETAILED DESCRIPTION OF THE INVENTION

Embodiments of the present invention will be described below with reference to the accompanying drawings.

Figure 2:
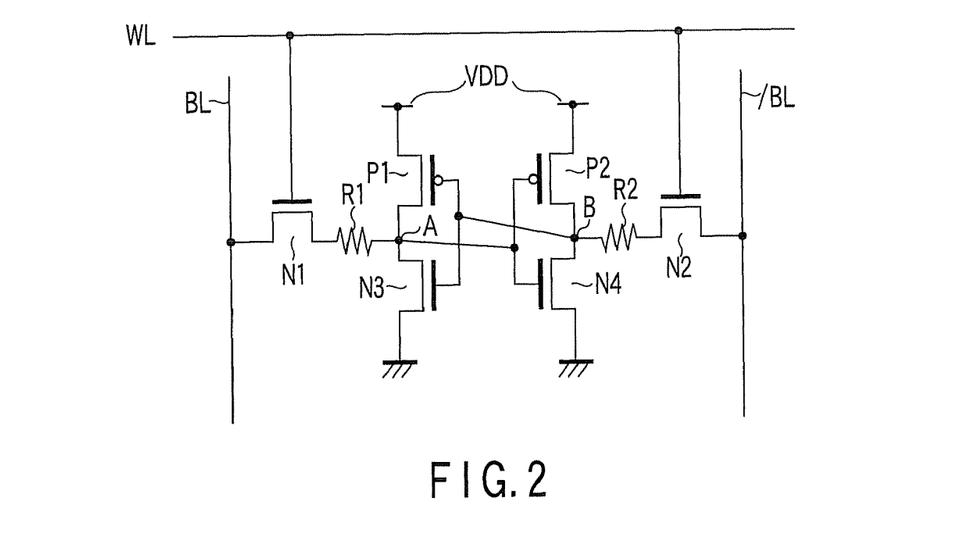
FIG. 2 is an equivalent circuit diagram showing an SRAM applied to the embodiment of the present invention.

FIG. 2 shows an equivalent circuit of an SRAM applied to an embodiment of the present invention. In FIG. 2, each of a series circuit of a load transistor P1 composed of a p-channel MOS (PMOS) transistor and a pull-down transistor N3 composed of an n-channel MOS (NMOS) transistor, and a series circuit of a load transistor P2 composed of a PMOS transistor and a pull-down transistor N4 composed of an NMOS transistor is connected to a node supplied with a power source VDD and the ground at both ends thereof. Gates of the load transistor P2 and the pull-down transistor N4 are connected to a connection node between the load transistor P1 and the pull-down transistor N3 serving as a first storage node A. Gates of the load transistor P1 and the pull-down transistor N3 are connected to a connection node between the load transistor P2 and the pull-down transistor N4 serving as a second storage node B. These transistors N3, N4, P1, and P2 constitute a storage section composed of two inverter circuits.

Further, an end of a current path of a pass gate transistor N1 composed of an NMOS transistor is connected to a bit line BL, and the other end thereof is connected to the first storage node A through a resistor R1. An end of a current path of a pass gate transistor N2 composed of an NMOS transistor is connected to a bit line /BL, and the other end thereof is connected to the second storage node B through a resistor R2. Gates of the pass gate transistors N1 and N2 are connected to a word line WL. Each of the resistors R1 and R2 is provided between each of the pass gate transistors N1 and N2 and each of the pull-down transistors N3 and N4. Each of these resistors R1 and R2 is connected to the source side of each of the pass gate transistors N1 and N2 when the SRAM cell is read. Specifically, for example, when a low level is stored in the storage node A, at read time, a current flows through the pass gate transistor N1 connected to the storage node A from the bit line BL side thereof which is preliminarily charged to the pull-down transistor N3. Thus, the resistor R1 is connected to the source side of the pass gate transistor N1, and the voltage of the source becomes high. Therefore, a voltage between the gate and the source becomes close to the threshold voltage of the pass gate transistor N1, and the driving force of the pass gate transistor N1 is reduced. Accordingly, the storage node A can be held at the low level, the stored data can be prevented from being inverted, and the stability of the SRAM cell can be improved.

On the other hand, when a data writing operation is performed, each of these resistors R1 and R2 is connected to the drain side of each of the pass gate transistors N1 and N2. Specifically, for example, when a low level is written in the storage node A, a current flow from the load transistor P1 to the bit line BL through the pass gate transistor N1. Thus, the resistor R1 is connected to the drain side of the pass gate transistor N1, and the voltage between the gate and the source is hardly affected. Thus, the driving force of the pass gate transistor can be prevented from being reduced, and the storage node A can be reliably held at the low level. Accordingly, it is possible to perform high-speed and reliable writing, and prevent the write characteristic of the SRAM from deteriorating.

As described above, by providing each of the resistors R1 and R2 between each of the pass gate transistors N1 and N2 and each of the first and second storage nodes A and B, it is possible to mitigate the trade-off margin between the stability at read time and the write characteristic of the SRAM.

However, when each of the resistors R1 and R2 is simply provided between each of the pass gate transistors N1 and N2 and each of the first and second storage nodes A and B, the cell size is increased as described previously. Thus, various ways and means are contrived in the embodiment.

First Embodiment

Figure 1:
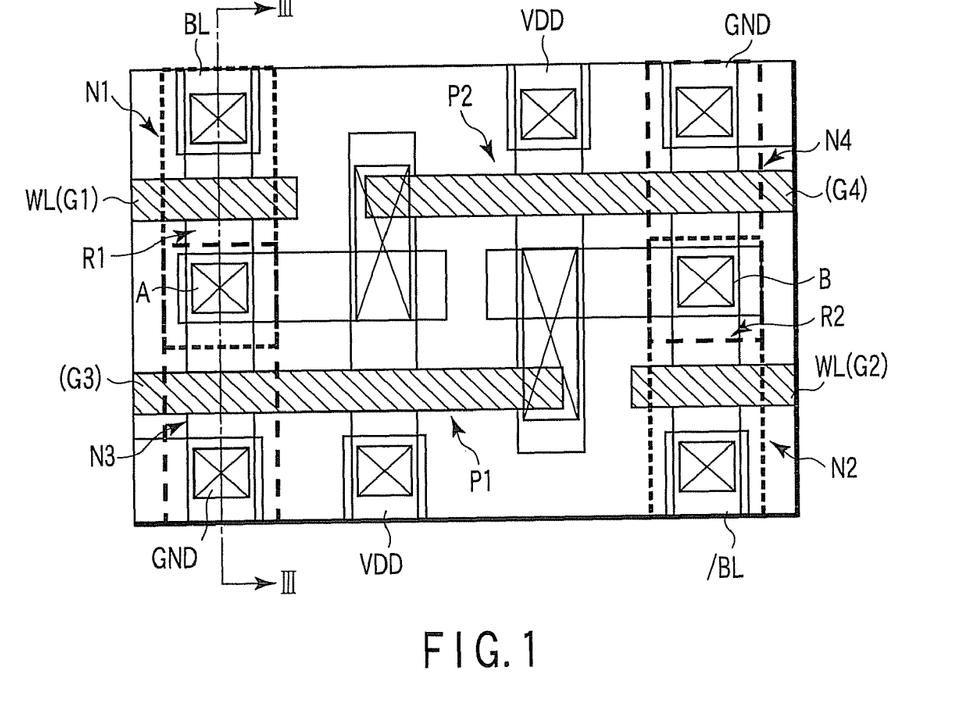
FIG. 1 is a plan view showing an SRAM according to a first embodiment.
Figure 3:
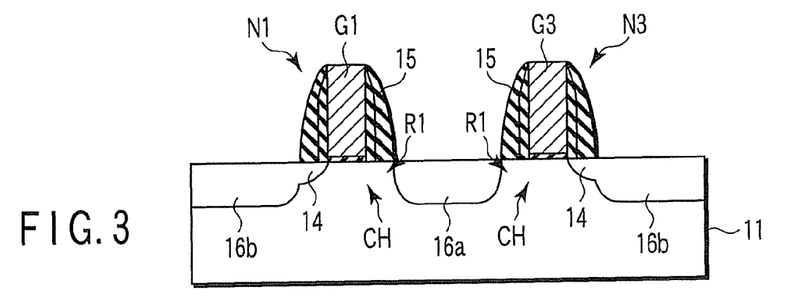
FIG. 3 is a cross-sectional view taken along line III-III in FIG. 1.

FIG. 1 shows a plan view of an SRAM including resistors according to a first embodiment, and FIG. 3 shows a cross-sectional view taken along line III-III in FIG. 1. In FIGS. 1 and 3, the same parts as those in FIG. 2 are denoted by the same reference symbols as those in FIG. 2.

In FIG. 1, N1 and N2 are pass gate transistors shown in FIG. 2, and N3 and N4 are pull-down transistors shown in FIG. 2. As shown in FIG. 3, in the first embodiment, a diffusion layer 16a between the pass gate transistor N1 and the pull-down transistor N3 is made to have a shape different from those of diffusion layers 16b outside the pass gate transistor N1 and the pull-down transistor N3, and the source/drain region of each of the pass gate transistor N1 and the pull-down transistor N3 is formed asymmetrical. More specifically, the channel regions of the pass gate transistor N1 and the pull-down transistor N3 are offset from the diffusion layer 16a toward the position between the pass gate transistor N1 and the pull-down transistor N3.

The diffusion layer connected to the bit line BL of the pass gate transistor N1 and the grounded diffusion layer of the pull-down transistor N3 have so-called extension regions. More specifically, an extension region 14 having a low impurity concentration is formed in a part of a p-type substrate 11 (or p-type well) corresponding to a side surface of each of gate electrodes G1 and G3, and the diffusion layer 16b having an impurity concentration greater than that of the extension region 14 is formed in a part of the substrate 11 corresponding to a sidewall insulating film 15 of each of the gate electrodes G1 and G3.

On the other hand, a region between the pass gate transistor N1 and the pull-down transistor N3 is composed of only the diffusion layer 16a having the same impurity concentration as that of the diffusion layer 16b, and no extension region is formed therein. As a result, the diffusion layer 16a is offset from the channel region formed below each of the gate electrodes G1 and G3. The part below the sidewall insulating films 15 in which no extension region is present acts as the resistor R1.

Although the cross-sectional shapes of the pass gate transistor N2 and the pull-down transistor N4 are not shown, the configurations of the pass gate transistor N2 and the pull-down transistor N4 are the same as those of the pass gate transistor N1 and the pull-down transistor N3. That is, the diffusion layer between the pass gate transistor N2 and the pull-down transistor N4 is formed asymmetrical with respect to the gate electrodes G2 and G4, and the channel region is offset from the diffusion layer having a high concentration. The part located below the sidewall insulating film acts as the resistor R2.

In this embodiment, the resistance set between the pass gate transistor N1 (N2) and the storage node A (B) needs to be greater than the resistance set between the pass gate transistor N1 (N2) and the bit line BL (/BL). Specifically, it is sufficient if each of the resistance values of the resistors R1 and R2 is about several kΩ, for example, 1 to 5 kΩ. This resistance applies to each of the succeeding embodiments.

Figure 4A:
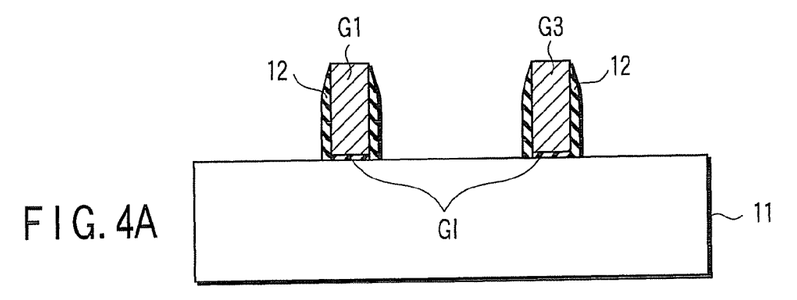
FIGS. 4A to 4C are cross-sectional views showing a method of manufacturing the configuration shown in FIG. 3.
Figure 4B:
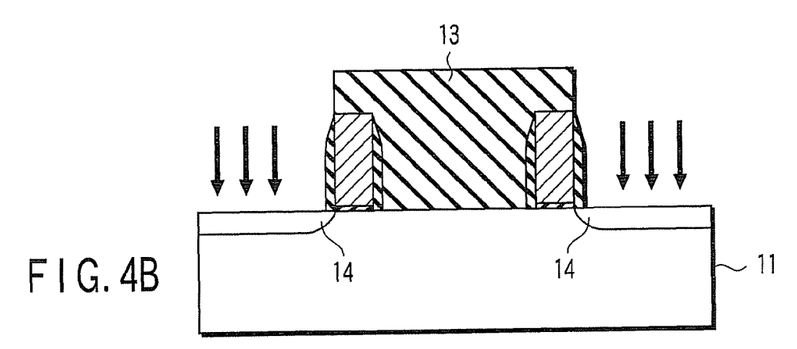
Figure 4C:
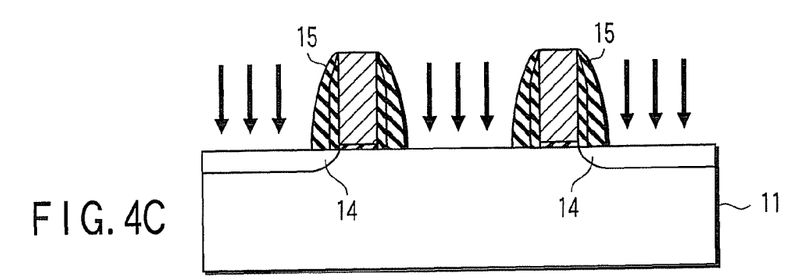

FIGS. 4A to 4C show a method of manufacturing the configuration shown in FIG. 3. As shown in FIG. 4A, gate electrodes G1 and G3 are formed by using, for example, polysilicon in, for example, a region of a p-type substrate 11 through gate insulating films G1. Offset spacers 12 are formed on the side surfaces of the gate electrodes by using insulating films.

Thereafter, as shown in FIG. 4B, a mask 13 is formed on a part of the substrate 11 between the gate electrodes G1 and G3, and on the gate electrodes G1 and G3, by using, for example, a photoresist. The mask 13 is used to introduce n-type impurities into the substrate 11, and an extension region 14 is formed on one side of the gate electrode G1 and on the other side of the gate electrode G3.

Subsequently, after the mask 13 is removed, for example, an insulating film is formed on the entire surface. This insulating film is removed by, for example, reactive ion etching (RIE), and sidewall insulating films 15 are formed on the sidewalls of the gate electrodes G1 and G3 (gate offset 12) as shown in FIG. 4C. Thereafter, n-type impurities are introduced into the substrate 11 by using the sidewall insulating film 15 as a mask, and diffusion layers 16a and 16b serving as a source/drain region are formed. The impurity concentration of the diffusion layers 16a and 16b is set greater than that of the extension region 14. The impurity concentration of the diffusion layers 16a and 16b is, for example, $5 \times 10^{20}$ atoms/cm$^3$, and the impurity concentration of the extension region 14 is, for example, $1 \times 10^{20}$ atoms/cm$^3$.

In this way, the diffusion layer 16a offset from the channel region formed below each of the gate electrodes G1 and G3 is formed between the gate electrodes G1 and G3 shown in FIG. 3.

According to the first embodiment described above, the resistor R1 is provided between the pass gate transistor N1 and the pull-down transistor N3, and the resistor R2 is provided between the pass gate transistor N2 and the pull-down transistor N4. As a result of this, the stability at the time of reading data from the SRAM can be improved, and the write characteristic at the time of data writing can be prevented from deteriorating.

Furthermore, an extension region 14 is not formed in the diffusion layer 16a between the pass gate transistor N1 (N2) and the pull-down transistor N3 (N4), whereby the source/drain region of each of the pass gate transistor N1 (N2) and the pull-down transistor N3 (N4) is formed asymmetrical, the channel region of each transistor is offset from the diffusion layer 16a, and this offset region is made to function as the resistor R1 (R2). As a result of this, it is possible to provide the resistors while preventing the occupation area of the cell from increasing.

Second Embodiment

Figure 5:
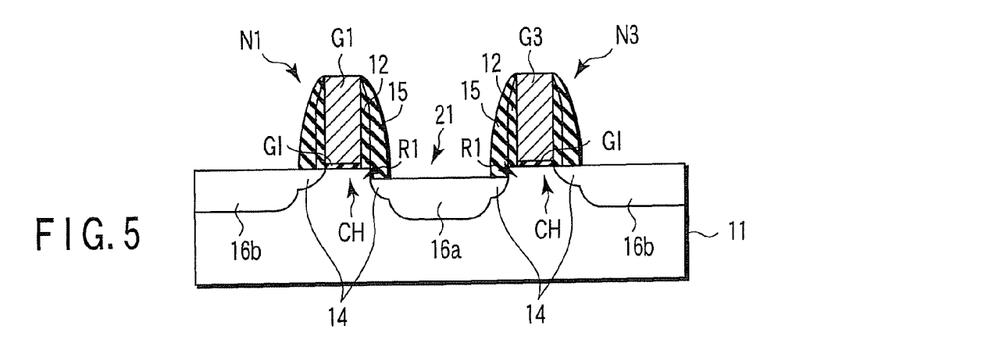
FIG. 5 is a cross-sectional view showing a main part of an SRAM according to a second embodiment.

FIG. 5 shows a main part of an SRAM according to a second embodiment. Incidentally, in the subsequent embodiment, the same parts as those of the first embodiment are denoted by the same reference symbols.

In the second embodiment shown in FIG. 5, a recess 21 is formed in a part of a substrate 11 between a pass gate transistor N1 and a pull-down transistor N3, and a surface of the substrate 11 is set lower than a border between a gate insulating film G1 and the substrate 11. A source/drain region of one of the pass gate transistor N1 and the pull-down transistor N3 is formed in the substrate 11 as a bottom part of the recess 21. This source/drain region is composed of an extension region 14 and a diffusion layer 16a. A channel region is offset from the extension region 14 by a film thickness of an offset spacer 12 in the depth direction of the recess 21, and this region functions as a resistor R1.

Figure 6A:
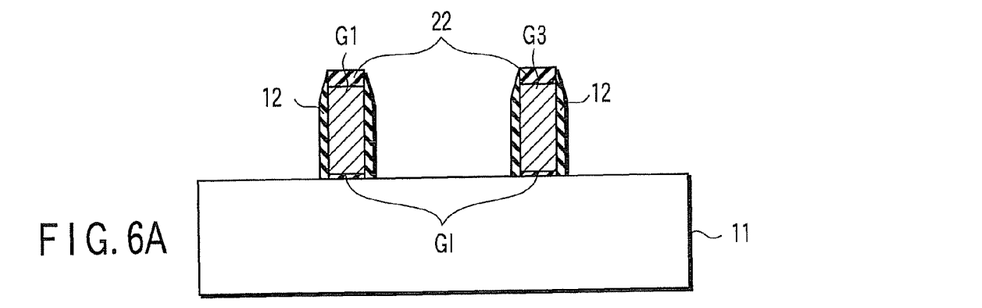
FIGS. 6A and 6B are cross-sectional views showing a method of manufacturing the configuration shown in FIG. 5.

FIGS. 6A, 6B, 7A, and 7B show a method of manufacturing the configuration shown in FIG. 5. First, as shown in FIG. 6A, gate electrodes G1 and G3 are formed on, for example, the substrate 11 through gate insulating films G1. On the upper part of each of the gate electrodes G1 and G3, a hard mask 22 composed of, for example, an insulating film is formed. More specifically, a gate insulating film G1, a polysilicon layer, and an insulating film are stacked in sequence on the substrate 11, and the insulating film, polysilicon layer, and gate insulating film G1 are etched by using, for example, a resist pattern (not shown) as a mask, whereby gate electrodes G1 and G3 each having a hard mask 22 are formed. Thereafter, on each of the gate electrodes G1 and G3, an offset spacer 12 is formed on the side surface of the hard mask 22 by using an insulating film.

Figure 6B:
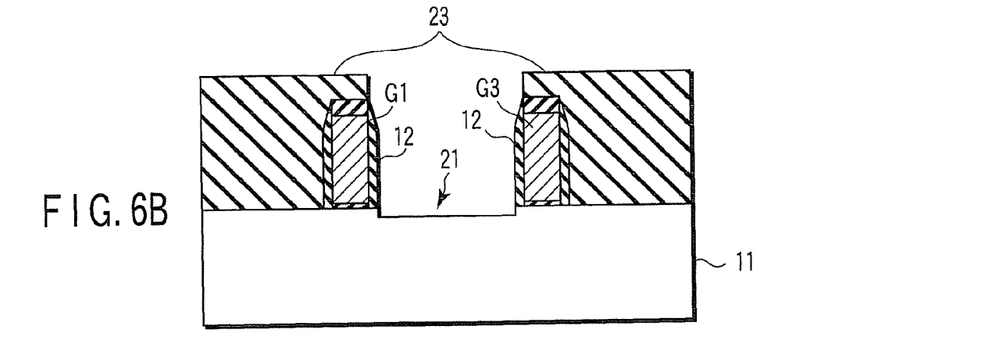

Then, as shown in FIG. 6B, for example, a resist pattern 23 is formed on the surface of the substrate 11 excluding a part between the gate electrodes G1 and G3. The surface of the substrate 11 is etched by, for example, RIE by using the resist pattern 23 and the offset spacer 12 as a mask, and the recess 21 is thus formed.

Figure 7A:
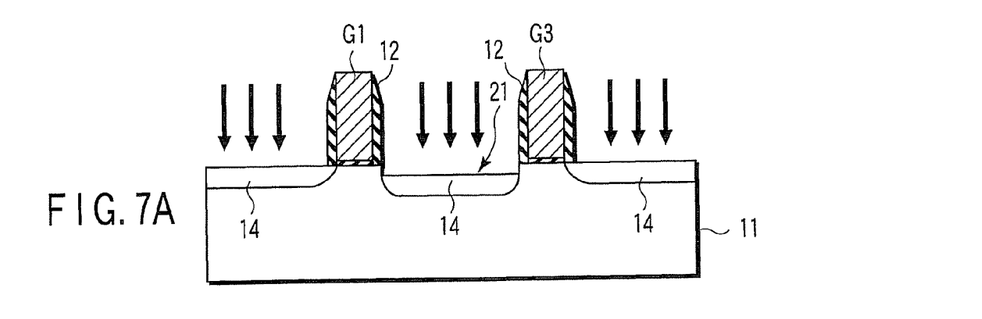
FIGS. 7A and 7B are cross-sectional views showing the manufacturing method continued from FIG. 6B.

Then, as shown in FIG. 7A, after the hard mask 22 and the resist pattern 23 are removed, n-type impurities are introduced into the substrate 11 by using the gate electrodes G1 and G3, and the offset spacer 12 as a mask, thereby forming the extension regions 14. Here, the extension region 14 formed between the gate electrodes G1 and G3 is formed so as to allow it to correspond to a part between the side surfaces of the offset spacers 12, and the extension regions 14 positioned outside the gate electrodes G1 and G3 are formed so as to allow them to correspond to the side surfaces of the gate electrodes G1 and G3.

Figure 7B:
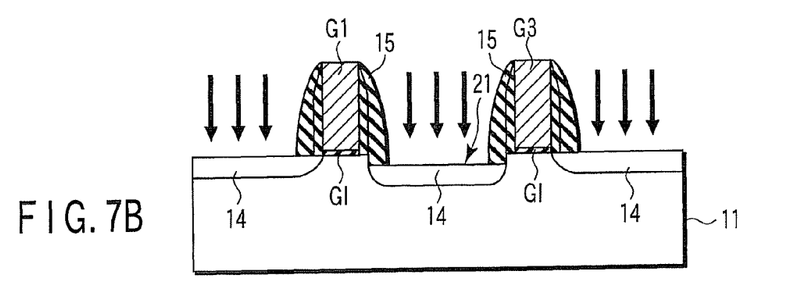

Thereafter, an insulating film is formed on the entire surface. This insulating film is etched by, for example, RIE, and sidewall insulating films 15 are formed on the side surfaces of the offset spacers 12 as shown in FIG. 7B. A bottom part of each of the sidewall insulating films 15 located between the gate electrodes G1 and G3 reaches a bottom surface of the recess 21 positioned lower than the border between the substrate 11 and the gate insulating film G1. As a result, a part of the bottom surface of the recess 21 is covered with each of the sidewall insulating films 15. Further, the bottom part of each of the sidewall insulating films 15 positioned outside the gate electrodes G1 and G3 is located on the surface of the substrate 11, i.e., on the border between the substrate 11 and the gate insulating film G1, and covers a part of the substrate 11.

Then, n-type impurities are introduced into the substrate 11 by using the sidewall insulating films 15 as a mask, and the diffusion layers 16a and 16b serving as the source/drain region are formed as shown in FIG. 5.

In the above configuration, the diffusion layer 16a having the extension regions 14, and each of the diffusion regions 16b located outside the gate electrodes G1 and G3 and each having the extension region 14 which is the other of the source/drain regions are formed asymmetrical with respect to the gate electrodes G1 and G3. That is, the channel region CH located below each of the gate electrodes G1 and G2 is offset from the diffusion layer 16b having the extension region 14 by an amount corresponding to the thickness of the offset spacer 12 toward the position between the gate electrodes G1 and G3, and is further offset therefrom in the depth direction of the recess 21. As a result of this, a film thickness region of the offset spacer 12 and the region in the depth direction of the recess 21 function as the resistor R1.

According to the second embodiment too, it is possible to form a resistor between the pass gate transistor N1 and the pull-down transistor N3 while preventing the cell size from increasing, as in the first embodiment.

Furthermore, according to the second embodiment, the recess 21 is formed on the substrate 11 between the gate electrodes G1 and G3, and the diffusion region 16a having the extension regions 14 is formed in the substrate 11 corresponding to the bottom part of the recess 21. As a result of this, the source/drain region can be made asymmetrical with respect to the gate electrodes G1 and G3 more reliably. Accordingly, it is possible to surely form the resistor 1 between the pass gate transistor N1 and the pull-down transistor N3, while preventing the cell area from increasing.

Third Embodiment

Figure 8:
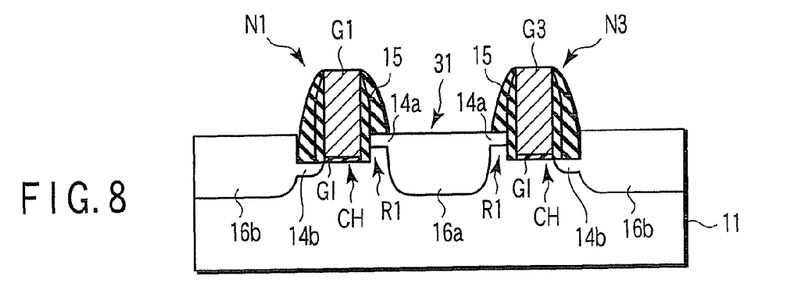
FIG. 8 is a cross-sectional view showing a main part of an SRAM according to a third embodiment.

FIG. 8 shows a main part of an SRAM according to a third embodiment. In the second embodiment, the recess 21 is formed between the pass gate transistor N1 and the pull-down transistor N3, and one of the source/drain regions is formed below the border between the substrate 11 and the gate insulating film G1. On the other hand, in the third embodiment, a region higher than a border between a substrate 11 and a gate insulating film G1 is formed between a pass gate transistor N1 and a pull-down transistor N3, and one of the source/drain regions is formed in this region. That is, the third embodiment has a so-called elevated source/drain structure.

In FIG. 8, a gate electrode G1 of the pass gate transistor N1 and a gate electrode G3 of the pull-down transistor N3 are formed on a surface of the substrate 11 through gate insulating films G1. Offset spacers 12 and sidewall insulating films 15 are formed on the sidewalls of the gate electrodes G1 and G3. A bottom part of a part of each of the sidewall insulating films 15 located between the gate electrodes G1 and G3 is formed so as to be in contact with a surface of a semiconductor layer 31 formed on the surface of the substrate 11, and a bottom part of a part of each of the sidewall insulating films 15 located outside the gate electrodes G1 and G3 is formed so as to be in contact with the surface of the substrate 11. The height (thickness) of the semiconductor layer 31 is set greater than, for example, the thickness of the extension region 14a formed in the semiconductor layer 31. The extension region 14a is formed below each of the sidewall insulating films 15 so as to be in contact with the side surface of each of the offset spacers 12. Further, a diffusion layer 16a serving as one of the source/drain regions is formed so as to be continuous with the extension region 14a.

Furthermore, in the substrate 11 outside the gate electrodes G1 and G3, an extension region 14b is formed so as to correspond to a part below each of the offset spacers 12 and each of the sidewall insulating films 15. A diffusion layer 16b serving as the other of the source/drain regions is formed so as to be continuous with each of the extension regions 14b. A surface of each of the diffusion layers 16b is at the same height as the surface of the semiconductor layer 31.

In the above configuration, as for the channel region CH of the pass gate transistor N1 and the pull-down transistor N3, and the diffusion layer 16a including the extension regions 14a, the diffusion layer 16a is offset from the channel regions located below the gate electrodes G1 and G3 toward a position between the gate electrodes G1 and G3. As a result of this, a part located below each of the offset spacers 12 and located at the side surface of each of the offset spacers 12 functions as the resistor R1.

FIGS. 9A, 9B, 10A, 10B, 10C, and 11 show a method of manufacturing the configuration shown in FIG. 8.

Figure 9A:
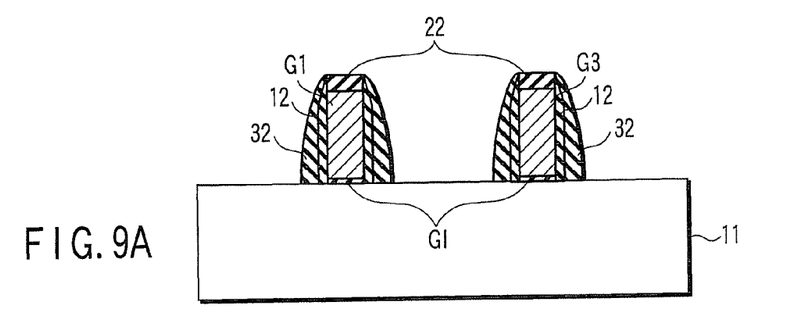
FIGS. 9A and 9B are cross-sectional views showing a method of manufacturing the configuration shown in FIG. 8.

First, as shown in FIG. 9A, in the same manner as in the second embodiment, gate electrodes G1 and G3 are formed on a substrate 11 through gate insulating films G1, and a hard mask 22 is formed on the upper part of each of these gate electrodes G1 and G3. An offset spacer 12 is formed on sidewalls of each of the gate electrodes G1 and G3 and each of the hard masks 22, and a sidewall insulating film 32 is formed on each of the offset spacers 12. In this case, the offset spacer 12 and the hard mask 22 are formed of, for example, a silicon nitride film, and the sidewall insulating film 32 is composed of a silicon oxide film. Materials of the offset spacer 12 and the sidewall insulating film 32 are not limited to these, any material having a large etching selection ratio can be used. Further, the material of the sidewall insulating film 32 is not necessarily limited to a single material.

Figure 9B:
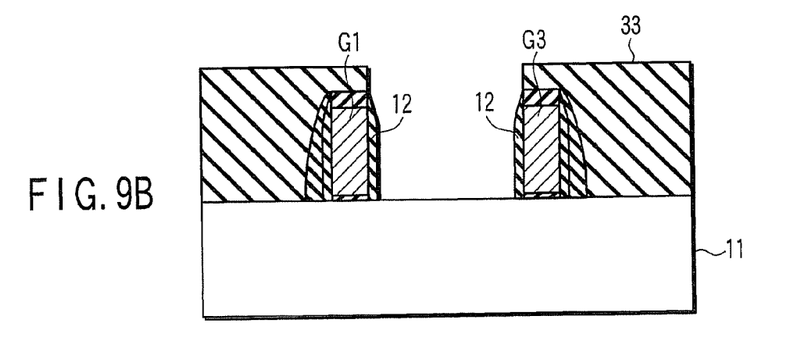

Subsequently, as shown in FIG. 9B, for example, a resist pattern 33 in which an opening is formed so as to allow it to correspond to the region between the gate electrodes G1 and G3 is formed. This resist pattern 33 exposes the sidewall insulating films 32 located between the gate electrodes G1 and G3. The sidewall insulating films 32 located between the gate electrodes G1 and G3 are etched and removed by, for example, RIE by using this resist pattern 33 as a mask.

Figure 10A:
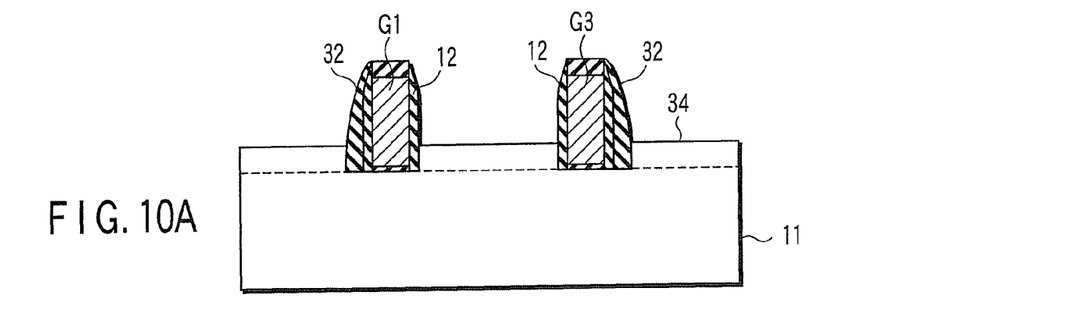
FIGS. 10A to 10C are cross-sectional views showing the manufacturing method continued from FIG. 9B.

Subsequently, as shown in FIG. 10A, after the resist pattern is 33 is removed, an epitaxial layer 34 which will become a semiconductor layer 31 is formed on the substrate 11.

Figure 10B:
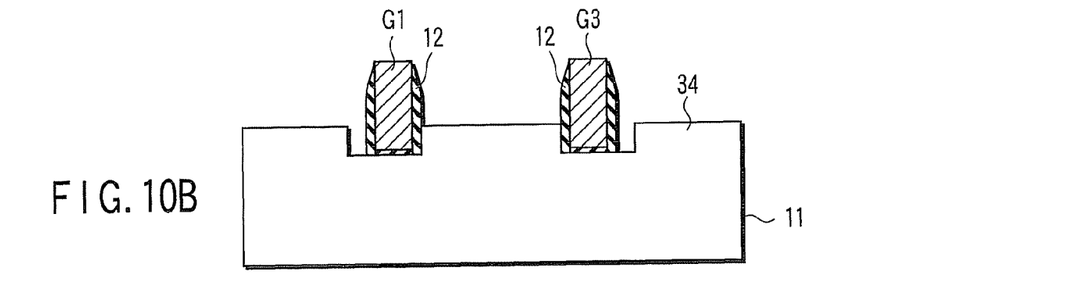

Thereafter, as shown in FIG. 10B, the remaining sidewall insulating films 32 and the hard masks 22 are etched and removed by, for example, RIE.

Figure 10C:
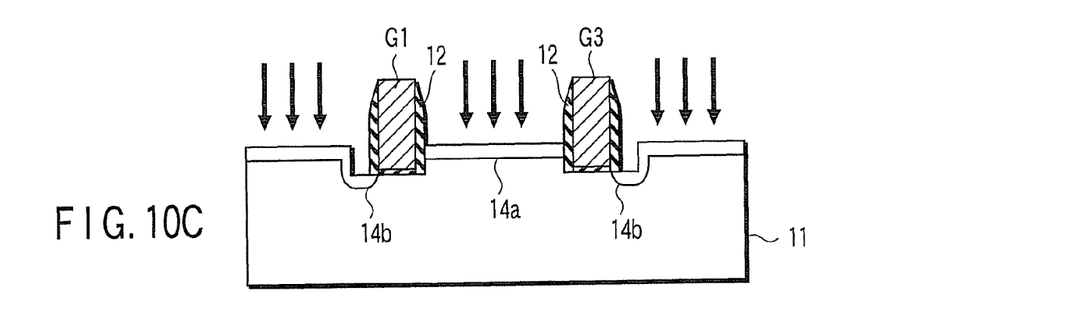

Subsequently, as shown in FIG. 10C, n-type impurities are introduced into the entire substrate 11 by using the gate electrodes G1 and G3, and the offset spacers 12 as a mask, whereby extension regions 14a and 14b are formed. The extension region 14a is formed in a region having a depth smaller than a film thickness of the epitaxial layer 34.

Figure 11:
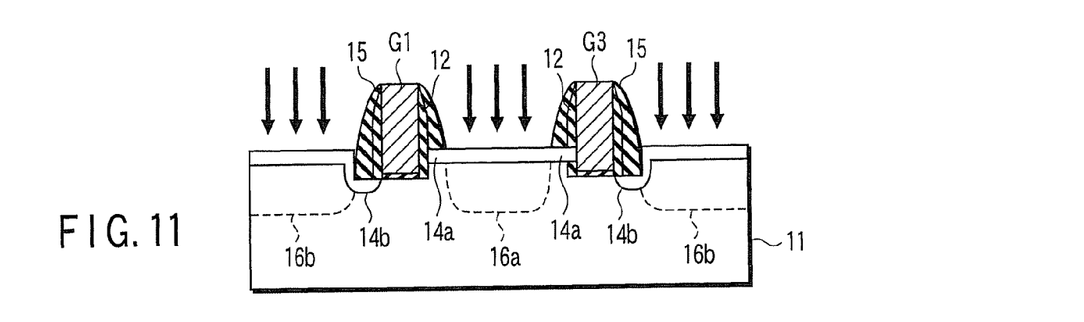
FIG. 11 is a cross-sectional view showing the manufacturing method continued from FIG. 10C.

Subsequently, as shown in FIG. 11, a sidewall insulating film 15 is formed on the side surface of each of the offset spacers 12. Thereafter, n-type impurities are introduced into the substrate 11 by using the gate electrodes G1 and G3, and the sidewall insulating films 15 as a mask, whereby a diffusion layer 16a serving as one of the source/drain regions is formed in the region between the gate electrodes G1 and G3, and diffusion layers 16b each serving as the other of the source/drain regions are formed in the regions outside the gate electrodes G1 and G3. In this manner, the transistors shown in FIG. 8 are formed.

According to the third embodiment described above too, it is possible to form the resistor R1 (R2) between the pass gate transistors N1 (N2) and N3 (N4) while preventing the cell occupation area from increasing.

Furthermore, according to the third embodiment, each of the extension regions 14a that constitutes one of the source/drain regions of each of the pass gate transistor N1 and the pull-down transistor N3 is formed in the epitaxial layer 34 which serves as a semiconductor layer 31 formed on the substrate 11, and is offset upwardly and toward the position between the gate electrodes G1 and G3 with respect to each of the channel regions CH located below the gate electrodes G1 and G3. As a result, the part located below each of the offset spacers 12 and located at the side surface of each of the offset spacers 12 is made to function as the resistor R1. Accordingly, it is also possible to reliably form the resistor R1 while preventing the cell area from increasing by this configuration.

Fourth Embodiment

Figure 12:
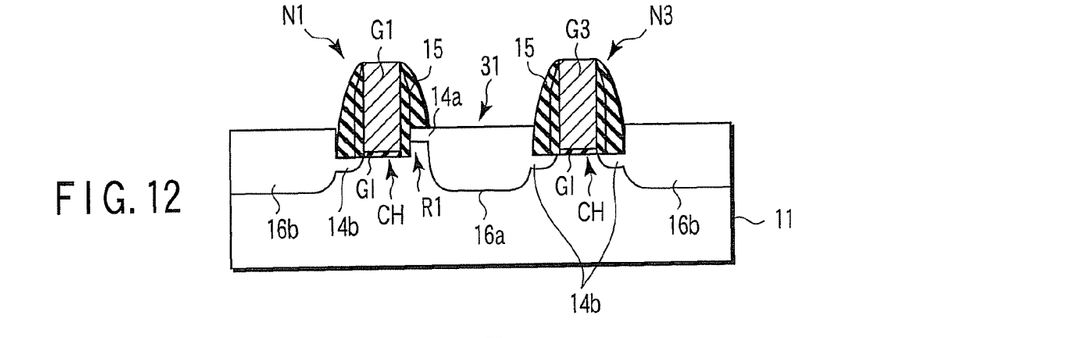
FIG. 12 is a cross-sectional view showing a main part of an SRAM according to a fourth embodiment.

FIG. 12 shows a main part of an SRAM according to a fourth embodiment. In the third embodiment, the channel regions of both the pass gate transistor N1 and the pull-down transistor N3, and the diffusion layer 16a having the extension regions 14a between the gate electrodes G1 and G3 are offset, and the resistor R1 is formed in both the pass gate transistor N1 and the pull-down transistor N3. On the other hand, in the fourth embodiment, only a pass gate transistor N1 is offset. As a result, driving force of a pull-down transistor N3 can be suppressed.

That is, in FIG. 12, what is different from FIG. 8 is that a source/drain region having an extension region of the pull-down transistor N3 is not offset with respect to a gate electrode G3.

FIGS. 13A, 13B, 13C, 14A, 14B, and 14C show a method of manufacturing the configuration shown in FIG. 12.

Figure 13A:
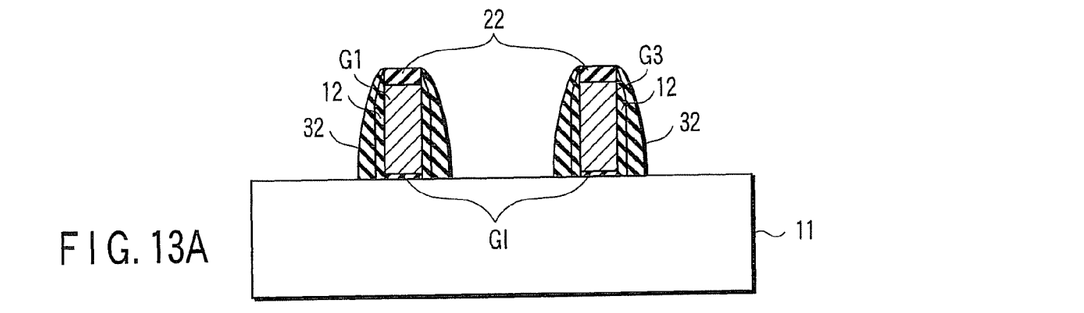
FIGS. 13A to 13C are cross-sectional views showing a method of manufacturing the configuration shown in FIG. 12.

First, as shown in FIG. 13A, in the same manner as in the third embodiment, gate electrodes G1 and G3 are formed on a substrate 11 through gate insulating films G1, and a hard mask 22 is formed on an upper part of each of the gate electrodes G1 and G3. An offset spacer 12 is formed on the sidewall of each of the gate electrodes G1 and G3 and on the sidewall of each of the hard masks 22, and a sidewall insulating film 32 is formed on each of these offset spacers 12. Here, the offset spacer 12 and the hard mask 22 are formed of, for example, a silicon nitride film, and the sidewall insulating film 32 is composed of a silicon oxide film. Materials of the offset spacer 12 and the sidewall insulating film 32 are not limited to these, any material having a large etching selection ratio can be used. Further, the material of the sidewall insulating film 32 is not necessarily limited to a single material.

Figure 13B:
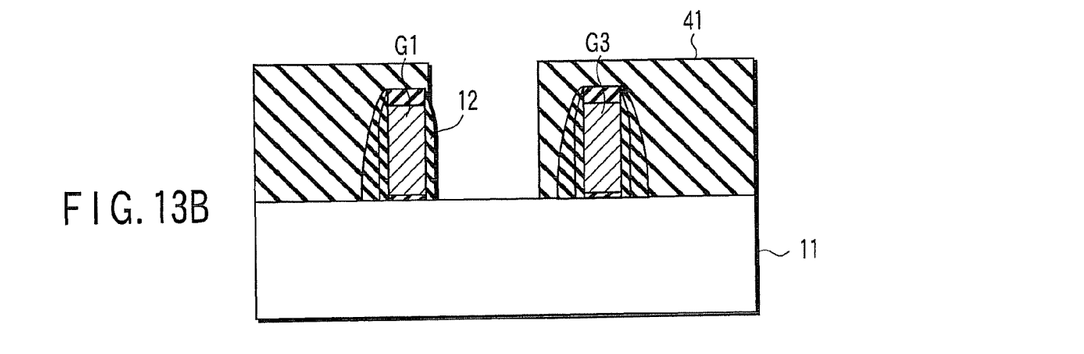

Subsequently, as shown in FIG. 13B, for example, a resist pattern 41 in which an opening is formed so as to allow it to correspond to the region between the gate electrodes G1 and G3 is formed. This resist pattern 41 entirely covers the gate electrode G3, and exposes the sidewall insulating films 32 of the gate electrodes G1. The sidewall insulating film 32 located between the gate electrodes G1 and G3 is etched and removed by, for example, RIE by using this resist pattern 41 as a mask.

Figure 13C:
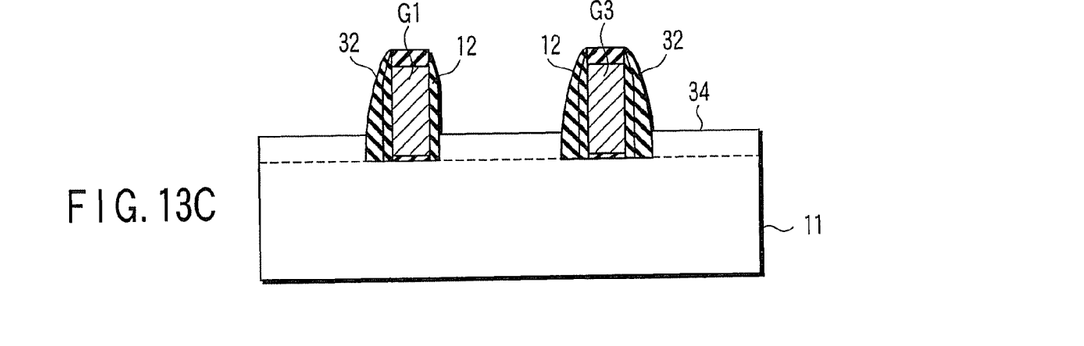

Then, as shown in FIG. 13C, the resist pattern 41 is removed. In this state, a part of the sidewall insulating film 32 of the pass gate transistor N1 on the pull-down transistor N3 side has been removed. Thereafter, an epitaxial layer 34 which will become a semiconductor layer 31 is formed on the substrate 11.

Figure 14A:
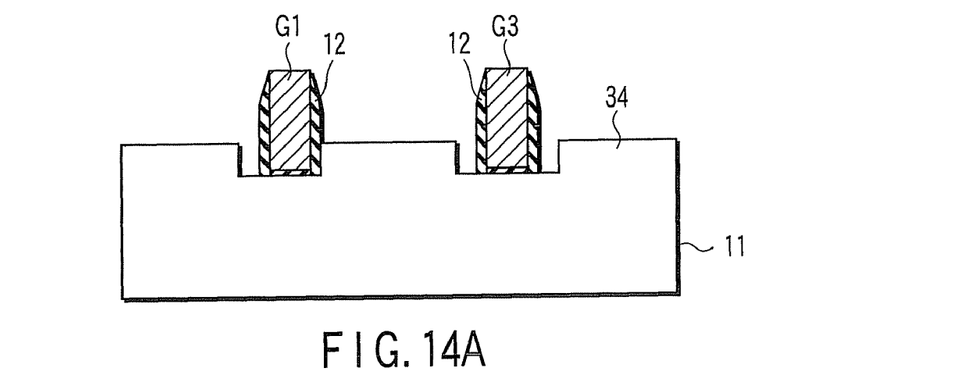
FIGS. 14A to 14C are cross-sectional views showing the manufacturing method continued from FIG. 13C.

After this, as shown in FIG. 14A, the remaining sidewall insulating films 32 and hard masks 22 are etched and removed by, for example, RIE.

Figure 14B:
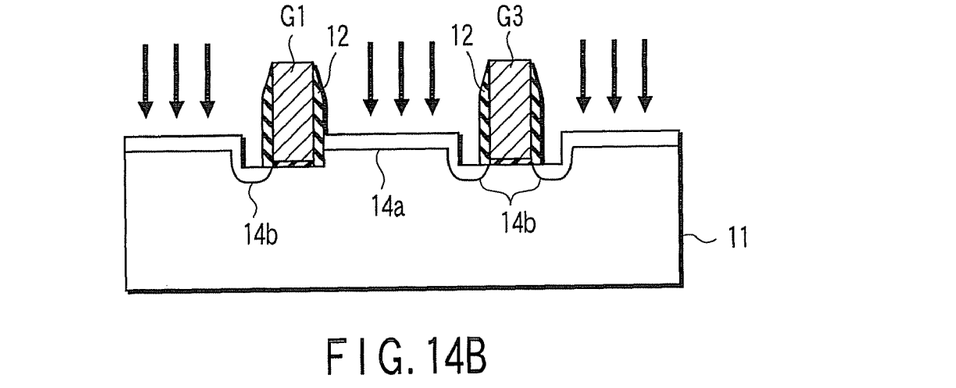

Then, as shown in FIG. 14B, n-type impurities are introduced into the entirety of the substrate 11 by using the gate electrodes G1 and G3, and the offset spacers 12 as a mask, whereby extension regions 14a and 14b are formed. The extension region 14a is formed in a region having a depth smaller than a film thickness of the epitaxial layer 34.

Figure 14C:
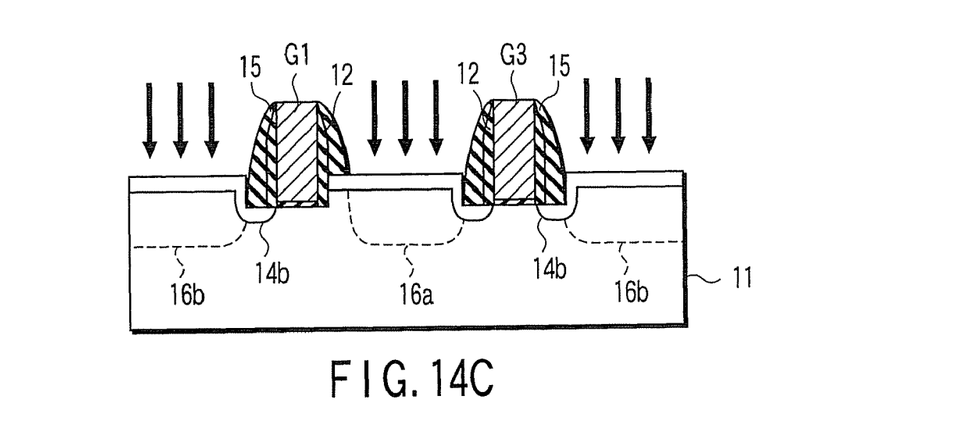

Subsequently, as shown in FIG. 14C, a sidewall insulating film 15 is formed on the side surface of each of the offset spacers 12. The bottom part of the sidewall insulating film 15 formed on the pull-down transistor N3 side of the pass gate transistor N1 is positioned on the epitaxial layer 34, and the other sidewall insulating films 15 are positioned on the substrate 11. After this, n-type impurities are introduced into the substrate 11 by using the gate electrodes G1 and G3, and the sidewall insulating films 15 as a mask, whereby a diffusion layer 16a serving as one of the source/drain regions is formed in the region between the gate electrodes G1 and G3, and diffusion layers 16b each serving as the other of the source/drain regions are formed in the regions outside the gate electrodes G1 and G3. In this manner, the transistors shown in FIG. 12 are formed.

According to the fourth embodiment described above too, the same advantage as the third embodiment can be obtained. Furthermore, according to the above fourth embodiment, only the extension region 14a of the pass gate transistor N1 (N2) on the pull-down transistor N3 side is formed in the epitaxial layer 34 serving as the semiconductor layer 31 formed on the substrate 11, and is offset with respect to the channel region CH positioned below the gate electrode G1 upwardly and toward the position between the gate electrodes G1 and G3. As a result, the part positioned at the bottom part of the offset spacer 12 of the pass gate transistor N1 (N2) and at the side surface part thereof is made to function as the resistor R1 (R2). Accordingly, the driving force of the pull-down transistor N3 (N4) can be prevented from being reduced.

Fifth Embodiment

Figure 15:
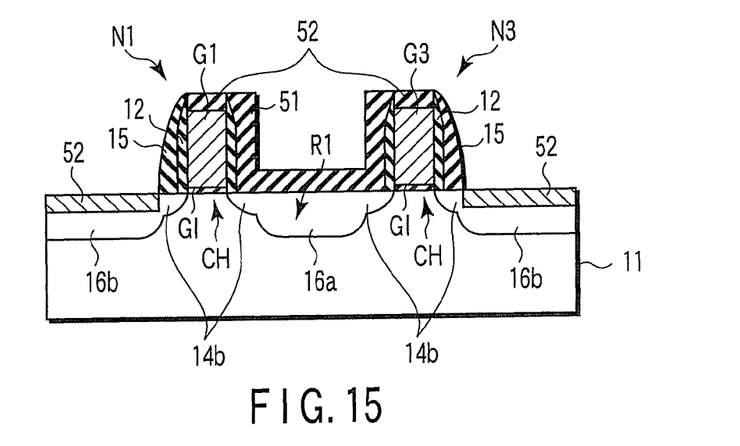
FIG. 15 is a cross-sectional view showing a main part of an SRAM according to a fifth embodiment.

FIG. 15 shows a main part of an SRAM according to a fifth embodiment. In the first to fourth embodiments, the source/drain region having the channel region and the extension region is offset with respect to the gate electrodes, thereby adding a resistor to the source/drain region of the transistors.

On the other hand, in the fifth embodiment, the resistance of the source/drain region is controlled, whereby a resistor is added to the source/drain region of the transistor. That is, as shown in FIG. 15, an insulating film 51 is formed on a diffusion layer 16a having an extension region 14b constituting one of source/drain regions positioned between gate electrodes G1 and G3 of a pass gate transistor N1 and a pull-down transistor N3, and on offset spacers 12 positioned between the gate electrodes G1 and G3, and a silicide layer 52 is formed on each of diffusion layers 16b which are located outside the gate electrodes G1 and G3, and include extension regions 14b each constituting the other of the source/drain regions. The resistance of the diffusion layer 16b on which the silicide layer 52 is formed is made less than the diffusion layer 16a on which no silicide layer 52 is formed. Accordingly, a resistor R1 is added to the diffusion layer 16a.

FIGS. 16A, 16B, 17A, 17B, and 17C show a method of manufacturing the configuration shown in FIG. 15.

Figure 16A:
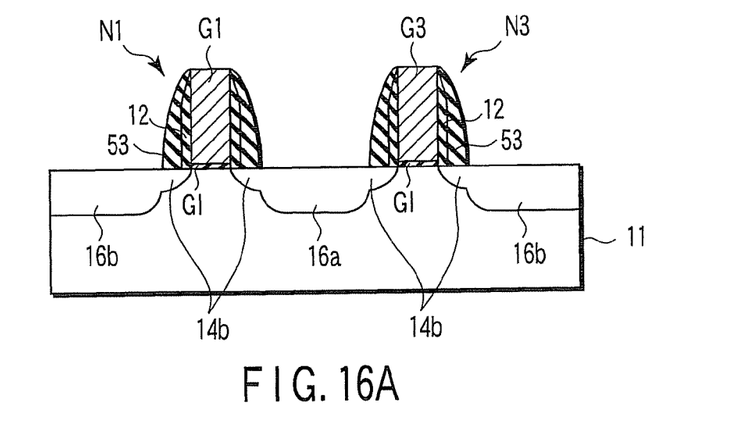
FIGS. 16A and 16B are cross-sectional views showing a method of manufacturing the configuration shown in FIG. 15.

First, as shown in FIG. 16A, gate electrodes G1 and G3 are formed on a substrate 11 through gate insulating films G1. Offset spacers 12 are formed on sidewalls of these gate electrodes G1 and G3. Extension regions 14b are formed in the substrate 11 by using the offset spacers 12 as a mask. Thereafter, sidewall insulating films 53 are formed on the offset spacers 12. Diffusion layers 16a and 16b serving as source/drain regions are formed in the substrate 11 by using the sidewall insulating films 53 as a mask.

Figure 16B:
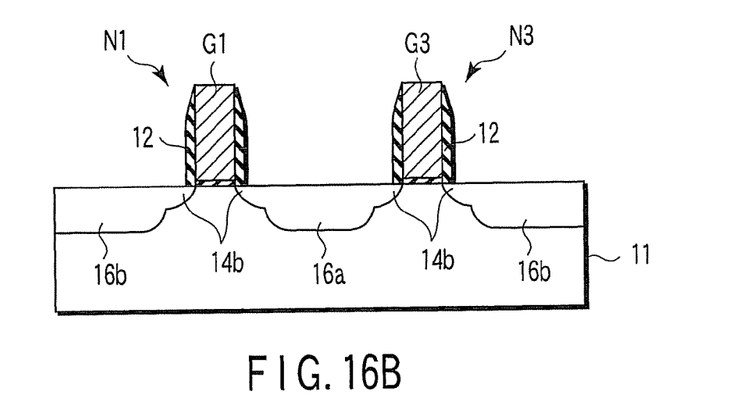

Then, as shown in FIG. 16B, the sidewall insulating films 53 are etched and removed by, for example, RIE.

Figure 17A:
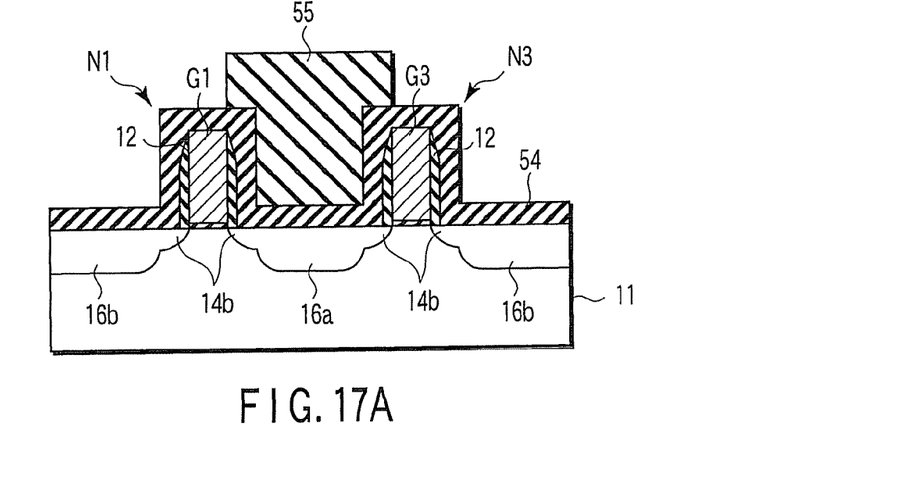
FIGS. 17A to 17C are cross-sectional views showing the manufacturing method continued from FIG. 16B.

Thereafter, as shown in FIG. 17A, an insulating film 54 is formed on the entire surface of the substrate 11. Subsequently, for example, a resist pattern 55 is formed so as to allow it to correspond to the region between the gate electrodes G1 and G3. This resist pattern 55 covers the region between the gate electrodes G1 and G3, and the offset spacers 12 positioned between the gate electrodes G1 and G3. Subsequently, the insulating film 54 is etched and removed by, for example, RIE by using the resist pattern 55 as a mask.

Figure 17B:
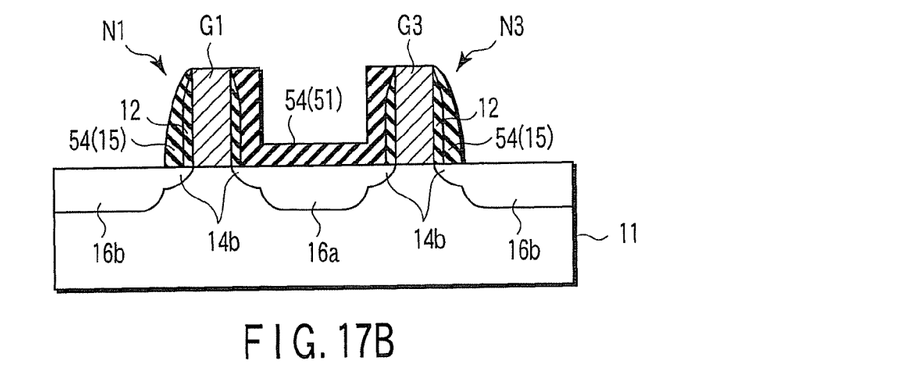

As a result of this, as shown in FIG. 17B, the insulating film 54 is left on a part of the substrate 11 between the gate electrodes G1 and G3, and on the offset spacers 12 positioned between the gate electrodes G1 and G3.

Figure 17C:
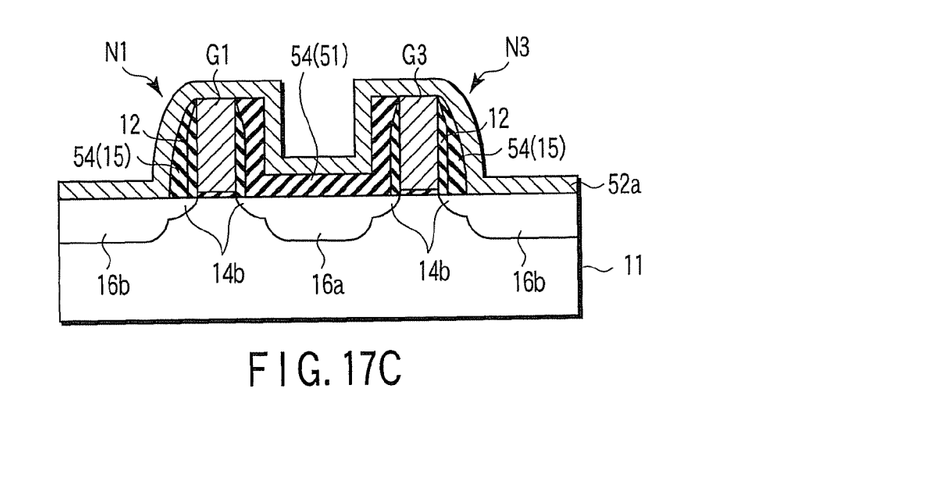

Thereafter, as shown in FIG. 17C, a metallic film 52a is formed by using one of metals, for example, tungsten, titanium, cobalt, and nickel. Subsequently, this metallic film 52a is annealed, and silicide layers 52 are formed on the gate electrodes G1 and G3, and on the diffusion layers 16b positioned outside the gate electrodes G1 and G3. Subsequently, the unreacted metallic film 52a is removed, and the configuration shown in FIG. 15 is completed.

According to the fifth embodiment described above, the diffusion layers 16a and 16b each including extension regions or an extension region are formed so as to be symmetrical with respect to the gate electrodes G1 and G3, and a silicide layer 52 is formed on each of the diffusion layers 16b which are positioned outside the gate electrodes G1 and G3, whereby the resistance of each of the diffusion layers 16b is made less than that of the diffusion layer 16a. Thus, the resistor R1 is formed in the diffusion layer 16a. According to the fifth embodiment described above too, it is possible to set the resistor R1 in the diffusion layer 16a while preventing the cell occupation area from increasing.

Sixth Embodiment

Figure 18:
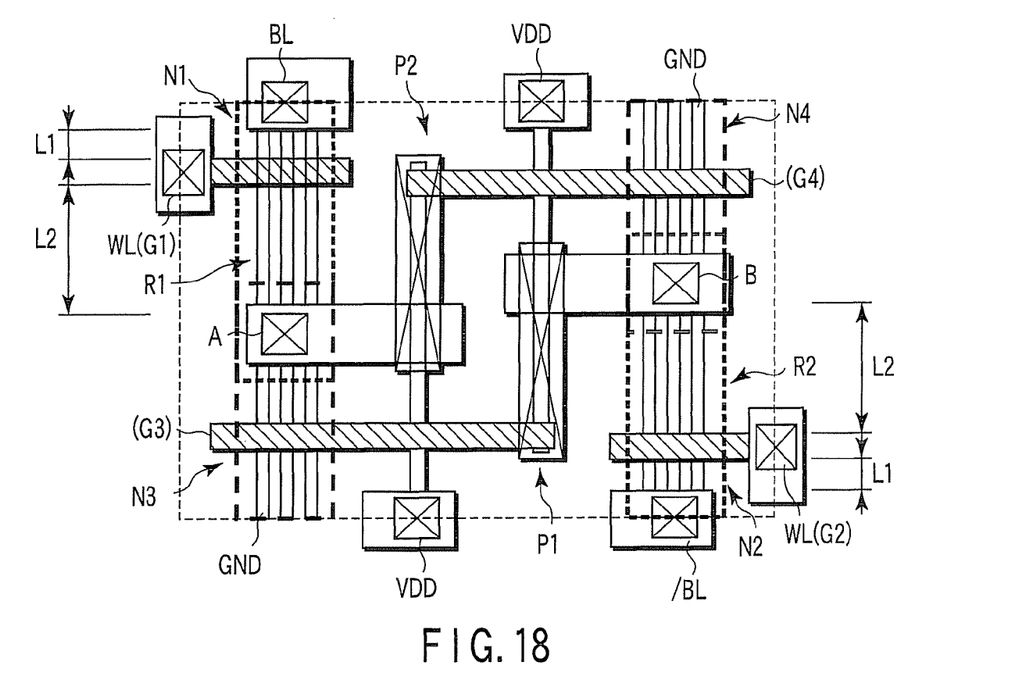
FIG. 18 is a plan view showing an SRAM according to a sixth embodiment.

FIG. 18 shows an SRAM according to a sixth embodiment. The sixth embodiment shows a case where each of transistors N1, N2, N3, N4, P1, and P2 which are shown in FIG. 1 is composed of a so-called fin-type field-effect transistor (hereinafter referred to as a fin transistor). In FIG. 18, the same parts as those in FIG. 1 are denoted by the same reference symbols as those in FIG. 1.

In FIG. 18, in the transistor N1 or N2, the source/drain region S/D is arranged so as to be offset with respect to the gate electrode G1 or G2. That is, in the transistors N1 and N2, the length L1 of the source/drain region connected to the bit line BL or /BL, and the length L2 of the drain/source region connected to the storage node A or B are set so as to satisfy the condition L1<L2. The length L2 of the drain/source region is set in such a manner that the resistance is several kΩ described previously.

Figure 19:
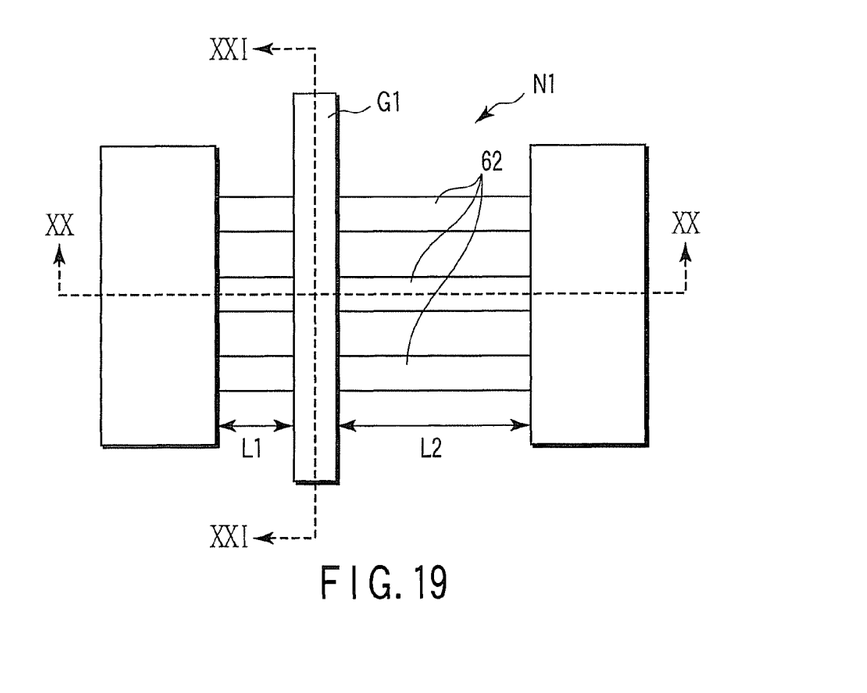
FIG. 19 is a plan view showing a transistor N1 shown in FIG. 18 extracted therefrom.
Figure 20:
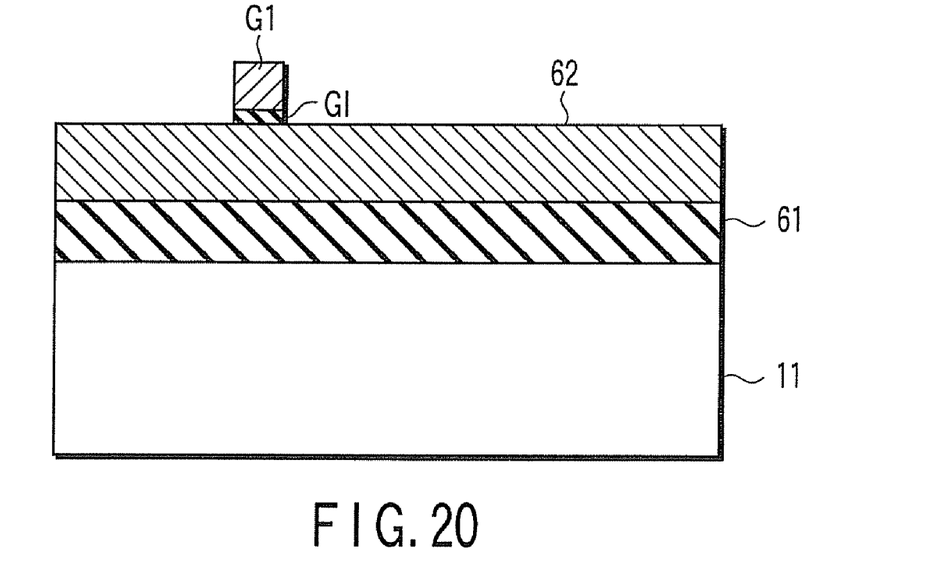
FIG. 20 is a cross-sectional view taken along line XX-XX in FIG. 19.
Figure 21:
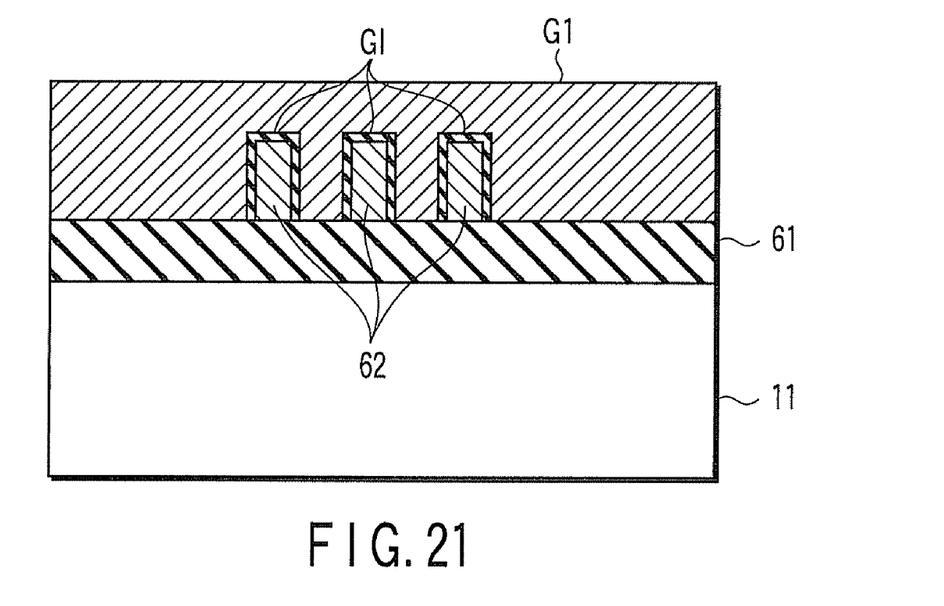
FIG. 21 is a cross-sectional view taken along line XXI-XXI in FIG. 19.

FIG. 19 shows the extracted transistor N1, and FIG. 20 is a cross-sectional view taken along line XX-XX in FIG. 19, and FIG. 21 is a cross-sectional view taken along line XXI-XXI in FIG. 19.

In FIGS. 19, 20, and 21, an embedded oxide film 61 is formed on the substrate 11, and a plurality of fins 62 are formed on the embedded oxide film 61 by using a silicon layer (semiconductor layer). A gate electrode G1 is formed in a direction perpendicular to these fins 62 through gate insulating films G1. The gate insulating film G1 is formed on, for example, side surfaces and a top surface of the fin 62, and the gate electrode G1 is also formed on the side surfaces and the top surface of the fin 62. The gate electrode G1 is formed at a position offset from the center of the fin in the longitudinal direction, the length of the source/drain region into which for example, n-type impurities are introduced and which is connected to the bit line BL is set at L1, and the length of the drain/source region connected to the storage node A is set at L2 which is longer than L1.

Incidentally, the shape of the fin transistor is not limited to those shown in FIGS. 19, 20, and 21, and can be variously modified.

According to the sixth embodiment described above, the n-channel transistor and the p-channel transistor constituting an SRAM are constituted of an n-channel fin transistor and a p-channel fin transistor, respectively, the length of a fin serving as a source/drain region constituting the pass gate transistor N1 (N2) is made asymmetrical with respect to the gate electrode G1 (G2), and a resistor R1 (R2) is added to one of the source/drain regions to be connected to the storage node A (B). In this case, the length of the fin is made constant, and the formation position of the gate electrode G1 (G2) is offset from the center of the fin length, whereby the source/drain region is made asymmetrical with respect to the gate electrode G1 (G2). Accordingly, it is possible to provide the resistor R1 (R2) while preventing the occupation area of the SRAM cell from increasing, improve the write characteristic, and secure the stability at the time of data reading.

Incidentally, in the first to fifth embodiments, the offset spacer 12 can be omitted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A static semiconductor memory device comprising:
   first and second storage nodes configured to store complementary data;
   a first transfer transistor connected between the first storage node and a first bit line; and
   a second transfer transistor connected between the second storage node and a second bit line,
   wherein each of the first and second transfer transistors is provided with a first diffusion layer connected to the first or second bit line and including an extension region, and a second diffusion layer connected to the first or second storage node and including an extension region, and
   the first diffusion layer is provided in a surface region of a substrate, and the second diffusion layer is provided in a bottom part of a recess provided in the substrate.

2. The device according to claim 1, further comprising:
   a first driving transistor connected to the first storage node; and
   a second driving transistor connected to the second storage node, wherein
   the recess includes first and second recesses, the first recess is formed in the substrate between the first transfer transistor and the first driving transistor, and the second recess is formed in the substrate between the second transfer transistor and the second driving transistor.

3. The device according to claim 2, wherein
   a channel region of each of the first transfer transistor and the first driving transistor is offset in a depth direction of the first recess, and a channel region of each of the second transfer transistor and the second driving transistor is offset in a depth direction of the second recess, each of the channel regions of the first transfer transistor and the first driving transistor is offset from one of source and drain regions formed in the first recess, and each of the channel regions of the second transfer transistor and the second driving transistor is offset from one of the source and drain regions formed in the second recess.

4. The device according to claim 3, wherein
each of the channel regions offset in the depth direction of the first or second recess can be operated as a resistor, and each of the channel regions is offset from one of the source and drain regions formed in each of the first and second recesses.

5. The device according to claim 4, further comprising:
a first spacer formed on a side surface of a gate electrode of the first transfer transistor;
a second spacer formed on a side surface of a gate electrode of the first driving transistor;
a third spacer formed on a side surface of a gate electrode of the second transfer transistor; and
a fourth spacer formed on a side surface of a gate electrode of the second driving transistor, wherein
the first recess is formed in the substrate between the first spacer and the second spacer, and
the second recess is formed in the substrate between the third spacer and the fourth spacer.

6. The device according to claim 1, wherein
a channel region of each of the first and second transfer transistors is offset with respect to the second diffusion layer toward the first or second storage node, and a region between the channel region and the second diffusion layer functions as a resistor.

* * * * *